(12) United States Patent  (10) Patent No.: US 6,262,887 B1
Lee                        (45) Date of Patent:    Jul. 17, 2001

(54) PRINTED CIRCUIT BOARD MOUNTING ASSEMBLY WITHIN A PORTABLE COMPUTER

(75) Inventor: Cheon-Yeol Lee, Seoul (KR)

(73) Assignee: SamSung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/525,328

(22) Filed: Mar. 13, 2000

(30) Foreign Application Priority Data

Mar. 13, 1999 (KR) .................................................. 99/8508

(51) Int. Cl.[7] ................................. G06F 1/16; H05K 7/02
(52) U.S. Cl. ........................... 361/683; 361/752; 361/758
(58) Field of Search ..................................... 361/679, 683, 361/724, 736, 737, 746, 751, 752, 758, 800, 804, 681, 680, 684

(56) References Cited

U.S. PATENT DOCUMENTS

| 4,742,478 | 5/1988 | Nigro, Jr. et al. . |
| 5,036,313 | 7/1991 | Lin et al. . |
| 5,376,759 | * 12/1994 | Marx et al. ........................... 174/255 |
| 5,436,803 | 7/1995 | Annis et al. . |
| 5,519,169 | * 5/1996 | Garrett et al. ....................... 174/35 R |
| 5,668,699 | * 9/1997 | Bell et al. ............................. 361/753 |
| 5,689,400 | 11/1997 | Ohgami et al. . |
| 5,729,146 | * 3/1998 | Swart ..................................... 324/754 |
| 5,784,256 | 7/1998 | Nakamura et al. . |
| 5,861,873 | * 1/1999 | Kikinis ................................... 345/157 |

* cited by examiner

Primary Examiner—Lynn D. Feild
(74) Attorney, Agent, or Firm—Robert E. Bushnell, Esq.

(57) ABSTRACT

An assembly of a printed circuit board mounted in a housing of a slim portable computer is described. The printed circuit board mounting assembly has a printed circuit board with penetration holes. A boss with a hole having a supporter formed around the circumference of the boss is installed in a housing of the portable computer and inserted into the penetration hole. A cap covering a top surface of the boss protrudes towards the upper side of the printed circuit board through the penetration hole and is in contact with the upper side, and a coupling member fastens to the boss through the cap to secure the printed circuit board to the housing.

20 Claims, 5 Drawing Sheets

PRINTED CIRCUIT BOARD MOUNTING ASSEMBLY WITHIN A PORTABLE COMPUTER

CLAIM OF PRIORITY

This application makes reference to, incorporates the same herein, and claims all benefits accruing under 35 U.S.C. §119 from an application entitled A Printed Circuit Board Mounting Assemble earlier filed in the Korean Industrial Property Office on Mar. 13, 1999, and there duly assigned Ser. No. 99-8508 by that Office.

BACKGROUND OF THE INVENTION

1. Field of the Invention

The present invention relates to a printed circuit board mounting assembly and, more particularly, to a printed circuit board mounting assembly installed in a housing of a thin electrical system such as a portable computer.

2. Discussion of Related Art

The development of computer technology induced various models of a computer such as a notebook computer, wallet personal computer (PC), personal digital assistant (PDA), and a hand-held personal computer (HPC). Therefore, the scope of usage has rapidly expanded. The computer trend is towards miniaturization and a slim design to allow for portability.

In the course of trying to make smaller and thinner portable computers, the space taken to mount a printed circuit board has become a design limitation. The circuit boards such as the main board, also called the motherboard, has key electronics for the function of the portable computer such as a microprocessor or a central processing unit (CPU) that controls the function of the portable computer, disk controllers that control permanent storage, and the random access memory for temporary data storage. A certain amount of space is needed in the housing of the portable computer to mount such a circuit board. As the portable computer becomes thinner, the mounting structures are reduced also and thereby losing some stability in the process. A stable circuit board is very important because if it is not stable then key components of the portable computer may be damaged.

Another problem in portable computers has been reducing the noise caused by electromagnetic interference (herein after referred to as "EMI"). Excessive amounts of EMI can affect the electrical functioning of the portable computer and outside electrical devices. Because of the size limitations, special structures that may take up space for reducing the EMI are discouraged.

An exemplar of the prior art Ohgami et al. (U.S. Pat. No. 5,689,400, Portable Electronic Apparatus Including Space-saving Component Mounting Features, Nov. 18, 1997) discloses a fairly large bracket that is used to mount the printed circuit board in a portable computer. Annis et al. (U.S. Pat. No. 5,436,803, EMI Shielding having Flexible Conductive Envelope, Jul. 25, 1995) discloses an electrically insulating flexible sheet such as polyethylene with embedded conductive fibers that forms an electromagnetic interference shielding enclosure for a circuit card within a portable computer. Such a structure takes up valuable space. Nakamura et al. (U.S. Pat. No. 5,784,256, Portable Computer having a Circuit Board Including a Heat-Generating IC Chip and a Metal Frame Supporting the Circuit Board, Jul. 21, 1998) discloses raised bosses supported by relatively large supporting walls around part of the bosses. The supporting walls subdivides the portable computer into smaller sections thereby limiting the available surface area needed to include other electrical structures. Nigro, Jr. et al. (U.S. Pat. No. 4,742,478, Housing for a Portable Computer, May 3, 1988) discloses fairly long bosses for mounting printed circuit boards. Lin et al (U.S. Pat. No. 5,036,313, Portable Computer with Improved Assembly Design, July 1991) discusses a portable computer housing assembly. The upper housing is connected to the lower housing using fasteners inserted though a bosses molded on the lower housing. A separate rail molding allowing for the printed circuit board to slide in is used. The rails take up more space needed for electronic parts.

SUMMARY OF THE INVENTION

It is an object of the invention to provide a printed circuit board mounting assembly capable of stably and strongly securing a printed circuit board and smoothly draining noise caused by EMI.

It is another object to provide a circuit board mounting structure that is not only very stable but also very small.

It is a further object to provide a circuit board mounting assembly that does not take extra space when providing for the draining of the noise caused by the EMI.

It is yet another object to provide a mounting structure for a circuit board that can be easily assembled.

According to features of the present invention, a circuit board mounting assembly has a printed circuit board that has a penetration hole pierced from the upper side to the lower side of the circuit board. A boss with a hole has a supporter formed around the circumference of the boss which is installed in a housing and inserted into the penetration hole of the circuit board. A cap covering a top surface of the boss is protruding towards the upper side of the printed circuit board through the penetration hole and in contact with the upper side, and a coupling member is fastened to the boss through the cap to secure the printed circuit board to the housing.

A conductive paint is coated on a surface of the cap and a metal layer is coated on an upper side of the printed circuit board connected to the cap.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
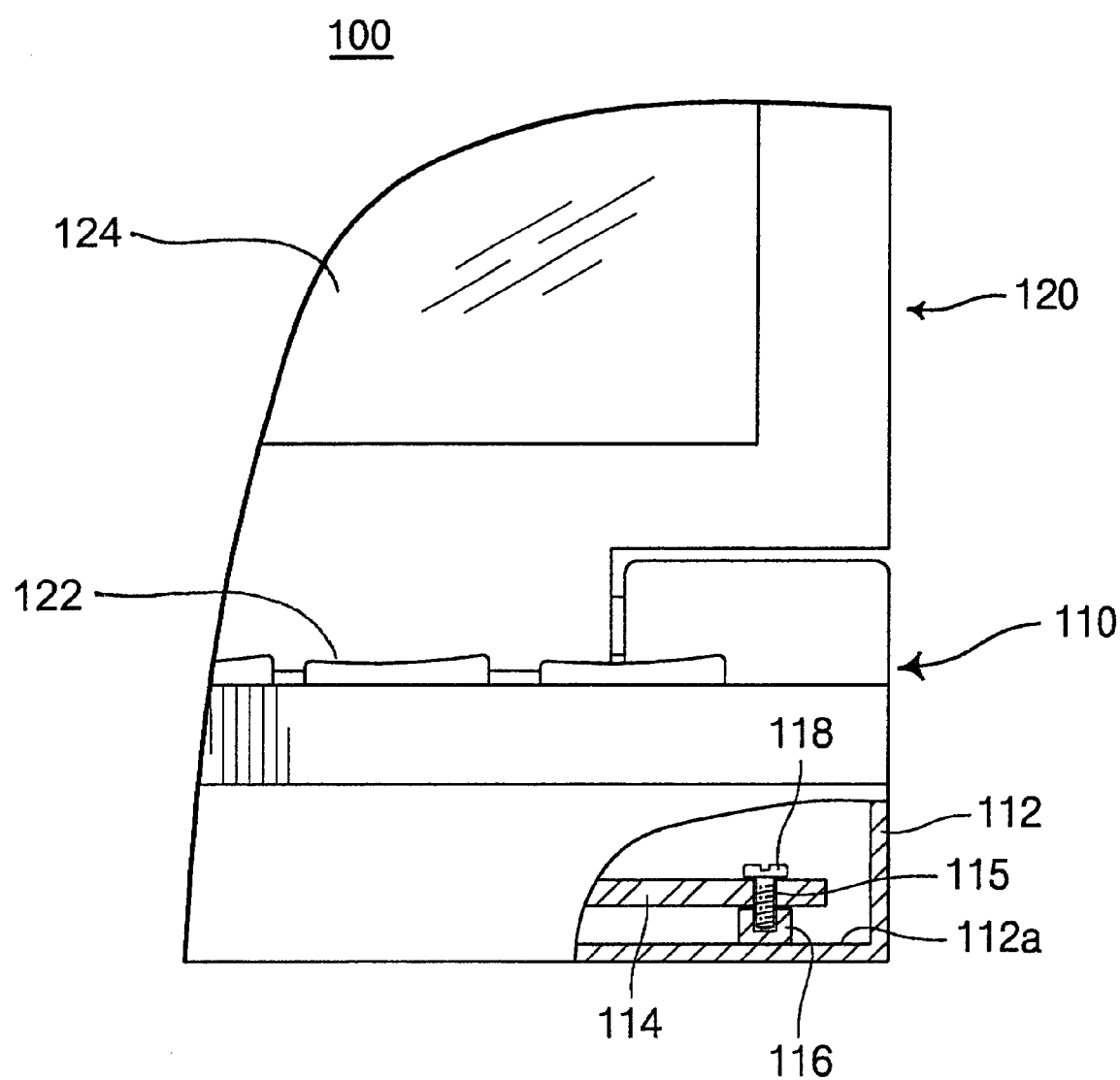
FIG. 1 shows a portable computer having a main board mounting assembly.

Now turning to the drawings, referring to FIG. 1, a portable computer 100 has a main body 110 upon which a keyboard 122 is mounted and a display unit 120 in which a liquid crystal display 124 is contained. A variety of printed circuit boards such as a main board 114 are installed in the housing 112 constituting the main body 110. As shown in FIG. 1, in a mounting assembly of an existing main board, multiple bosses are installed upon a bottom surface 112a of the housing 112 in which the main board 114 is installed. In the main board 114, a penetration hole 115 is formed at a position corresponding to the boss 116. For example, the main board 116 is mounted upon the housing 112 by placing the main board 114 upon the boss 166 and coupling a screw 118 to the boss 116 through the penetration hole 115.

In the portable computer 100 having such a main board mounting assembly, the height of the bosses 116 are minimized to which the main board is secured. The minimized bosses 116 lower the installation height of the main board 114. However, coupling the screw 118 to the boss 116 of a low height is not strong, so that the main board 118 is unstably secured. As a result, any minor shock to the computer 100 may lead to the movement of the main board 114 and therefore severe damage to the computer 100.

Further, in the main board mounting assembly, noise caused by electromagnetic interference (EMI) is drained to the housing 112 through the screw 118 contacted with an upper side of the main board 114.

Figure 2:
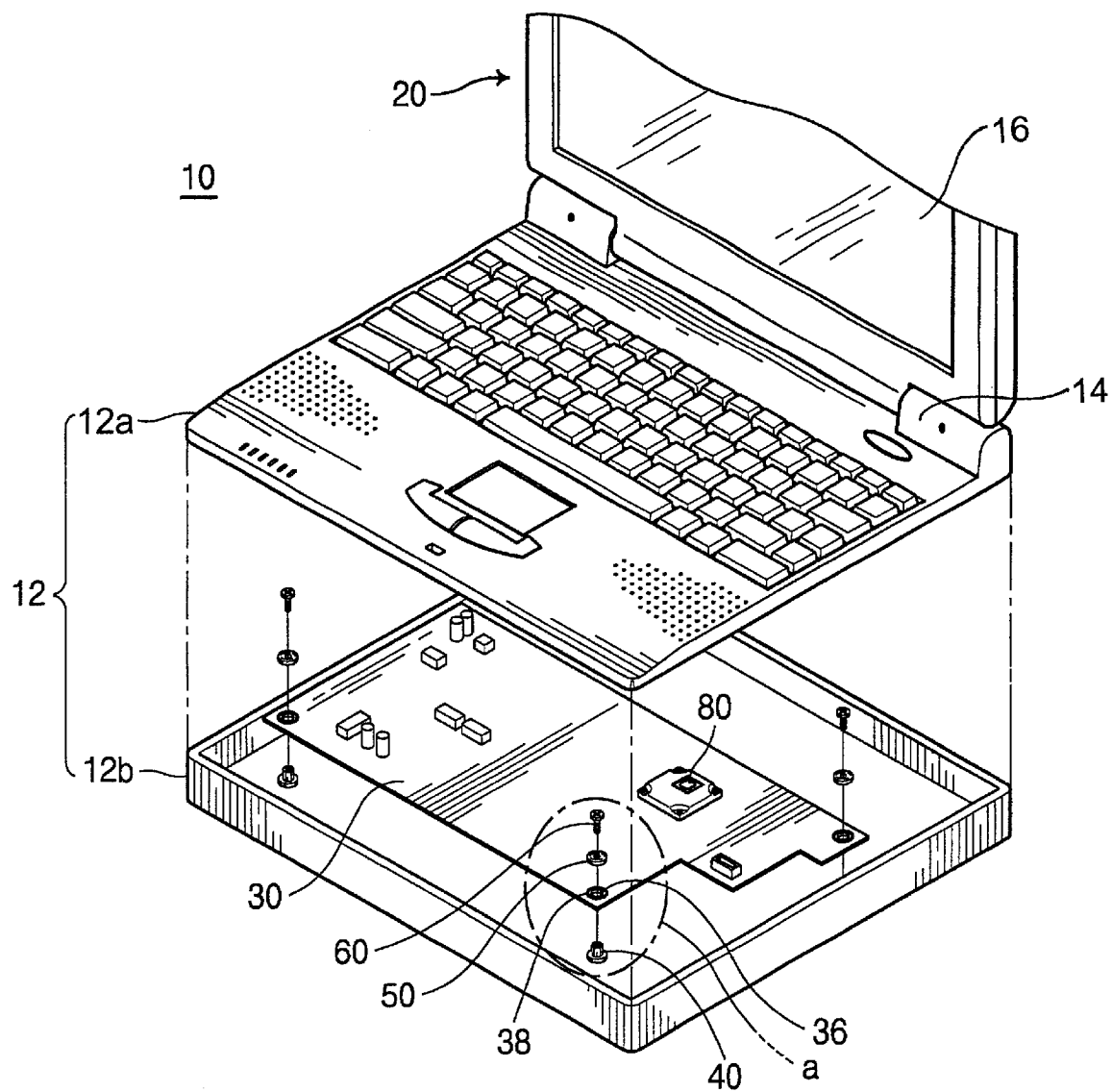
FIG. 2 shows a portable computer having a main board mounting assembly according to the present invention.
Figure 3:
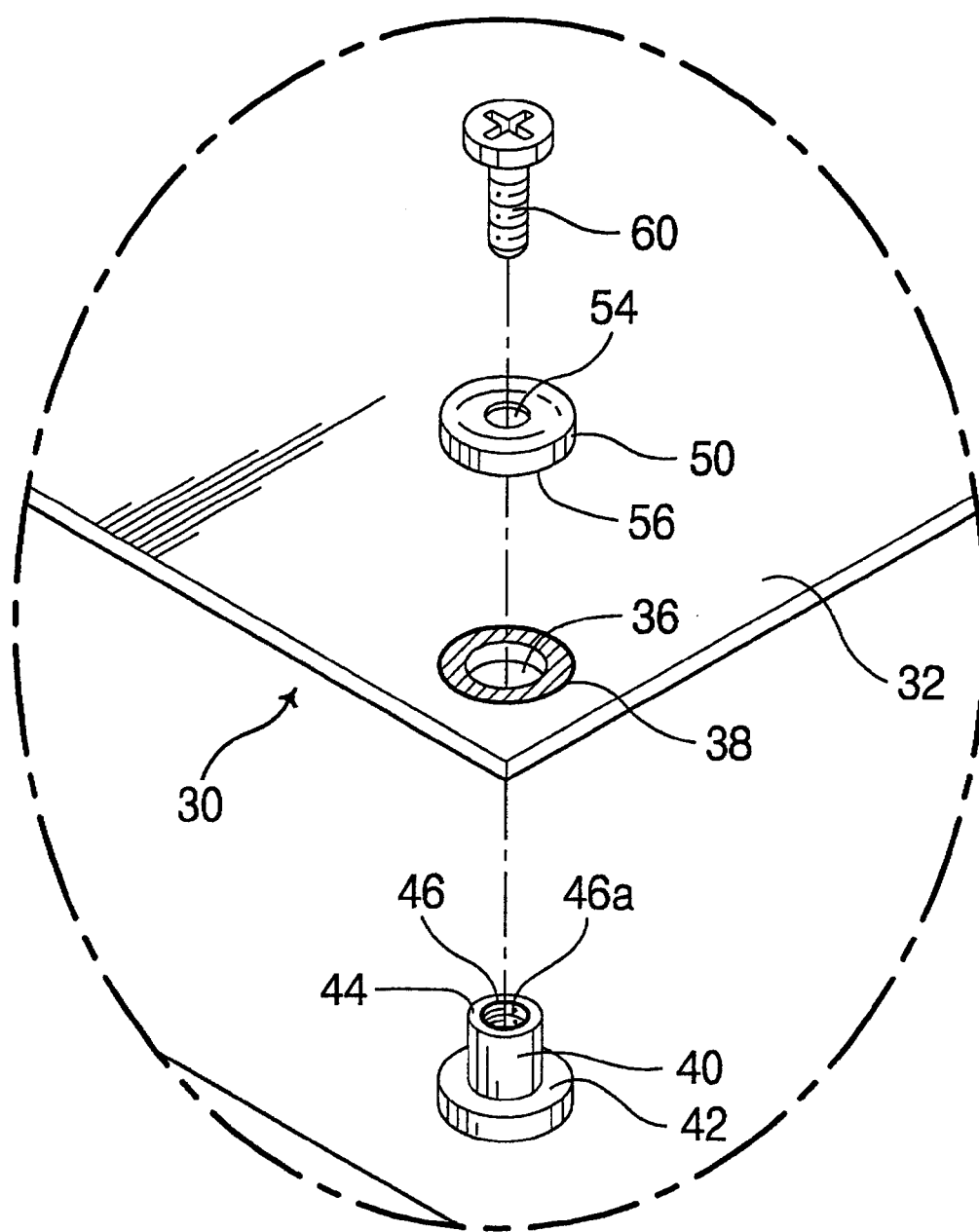
FIG. 3 is a partially enlarged view of "a" shown in FIG. 2.

As shown in FIGS. 2 and 3, a portable computer 10 has a main body housing 12, a display unit 20, and a main board 30.

The display unit 20 is pivotally coupled to the main body housing 12 by using a hinge assembly 14 in the back of the main body housing 12. A display screen 16 disposed in front of the display unit 20 may be a display device such as a video monitor or liquid crystal display.

The main body housing 12 has a top housing 12a and a bottom housing 12b. In the portable computer 10, coupling the top housing 12a to the bottom housing 12b forms an internal space. The main board 30 and various electrical elements are received in the internal space. Examples of the electrical elements are a power supply device such as a battery, storage devices such as a hard disk drive and a floppy disk drive, and a pointing device.

Referring to FIGS. 2 and 3 again, the following is the description of a main board mounting assembly according to one embodiment of the invention. A penetration hole 36 is formed in the main board 30, penetrating from an upper side 32 to a lower side 34 (shown in FIG. 4A). A metal layer 38, serving as a ground plate, is adhered to the upper side 32 of the main board 30. A central processing unit (CPU) is mounted upon the upper side 32 thereof. For example, numerous semiconductor integrated circuit devices may be mounted upon the main board 30. Multiple bosses 40 may be installed on a bottom surface of the housing 12 in which the main board 30 is installed. The boss 40 is so high that it may protrude through the penetration hole 36 to the upper side 32. A supporter 42 for supporting the lower side 34 is formed in a periphery of the boss 40. The boss 40 may have an insert 46 in which a screw hole 46a is formed. A cap 50 is coupled to a top surface 44 of the boss 40. A groove 52 (shown in FIG. 4A) is formed in a bottom surface of the cap 50 so as to cover the top surface 44. For example, the cap 50 covers the top surface 44 of the boss 40 that is protruding through the penetration hole 36 towards the upper side 32 of the main board 30. At this time, the lower side 56 of the cap 50 is contacted with the metal layer 38 that is adhered to the upper side 32. The metal layer 38, although adhered to the upper side 32, may be adhered to the lower side 34 contacting with the supporter 42 and an outer surface of the boss 40, and an inner surface of the penetration hole 36. The main board 30 is secured to the housing 12 by means of a screw 60 which is coupled to the screw hole 46a of the boss 40 through a hole 54 of the cap 50. Further, a surface of the cap 50 is coated with a conductive paint. It will be understood with the benefit of the invention that surfaces of the housing 12 and the boss 40 are also coated with the conductive paint. For example, noise caused by EMI that is created in the main board 30 is drained from the metal layer 38 through the cap 50 to the housing 12.

One assembly feature of the invention can be described as follows. Although installation height of a main board 30 is not increased, height of a boss 40 may be increased as high as the installation height because the boss is protruding through a penetration hole 36 to the upper side 32 of the main board 30.

Another assembly feature of the invention is to have a cap 50 that covers an upper side 44 of a boss 40 protruding towards a top surface 32 of a main board 30 and presses the top surface thereof while coupling a screw 60, enabling the main board 30 to be firmly placed on a supporter 42 of the boss 40.

Further another assembly feature of the invention is to smoothly drain noise caused by EMI to a housing because a metal plate adhered to an upper side 32 of a main board 30, a bottom surface 62a of a cap, a boss 40, and a screw 60 are contacting one another through a wide portion. In this case, the EMI is created in the main board through the contacted wide portion.

Figure 4A:
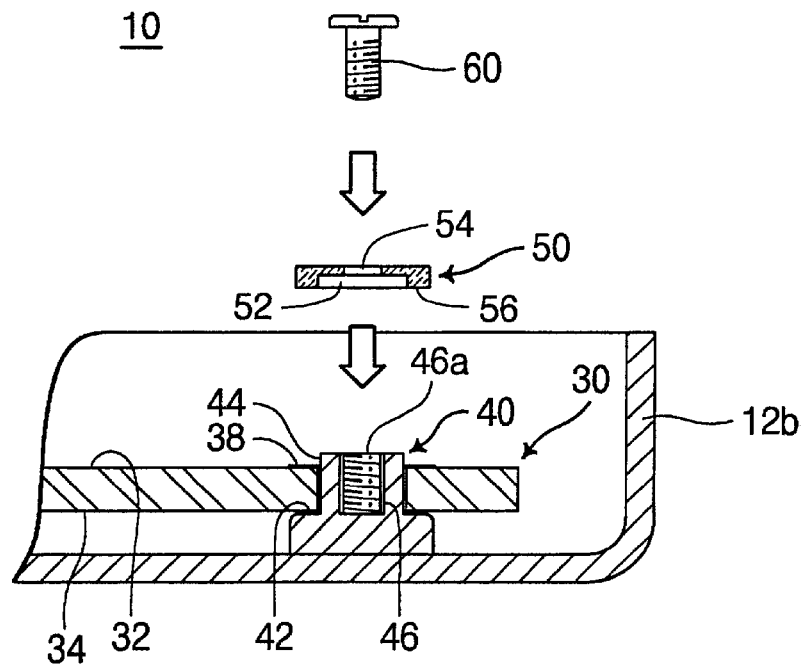
FIGS. 4A–4B sequentially show a mounting state of a main board in a portable computer according to one embodiment of the invention.
Figure 4B:
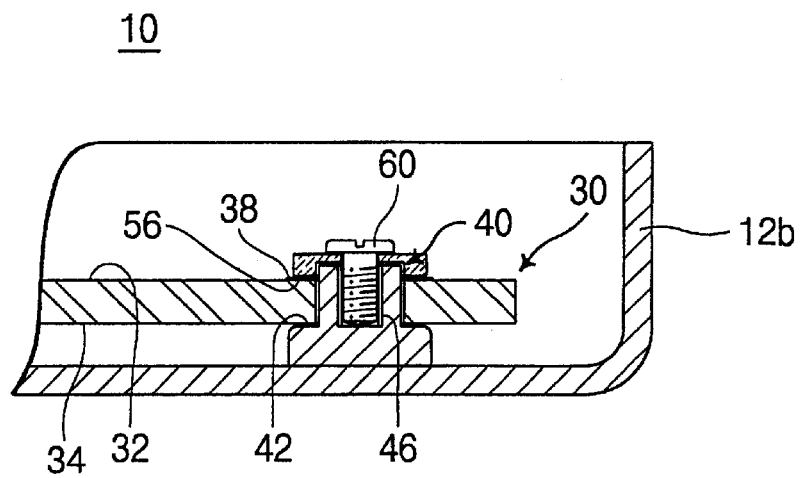

A method of installing a main board 30 in a bottom housing 12b will be described with reference to FIGS. 4A–4B. First, a boss 40 is inserted into a penetration hole 36 of the main board 30 so that a lower side 34 may be placed on a supporter 42 of the boss 40. A cap 50 covers the upper side 44 of the boss 40 protruding towards the upper side 32 of the main board 30 through the penetration hole 36. If the screw 60 is then coupled to a screw hole 46a of the boss 40 through a hole 54 of the cap 50, the cap 50 presses the main board 30. Since the main board 30 is placed on the supporter 42 of the boss 40, installation height of the main board 30 may maximally be reduced irrespective of the height of the boss 40. A shorter boss 40 will still be stable. Formed as high as the thickness of the main board 30, the boss 40 may have a screw hole as deep as such. The screw 60 may strongly be coupled to the boss 40, and the main board 30 may firmly be secured to the boss 40.

Such a main board mounting assembly of the invention may effectively be applied to, in particular, a slim portable computer. A lower side 56 of the cap 50 is in contact with the metal layer 38 adhered to the upper side 32 of the main board 30. The cap 50 is in contact with the screw 60 and the upper side 44 of the boss 40. The screw 60 is in contact with the boss 40. In this regard, a ground metal plate 38 adhered to the upper side 32 of the main board 30, the cap 50, the boss 40, and the screw 60 are in contact with one another through a wide portion. Accordingly, EMI noise created in a main board may be smoothly drained from the main board 30 through the contacted wide portion 38 to a housing 12.

Figure 5:
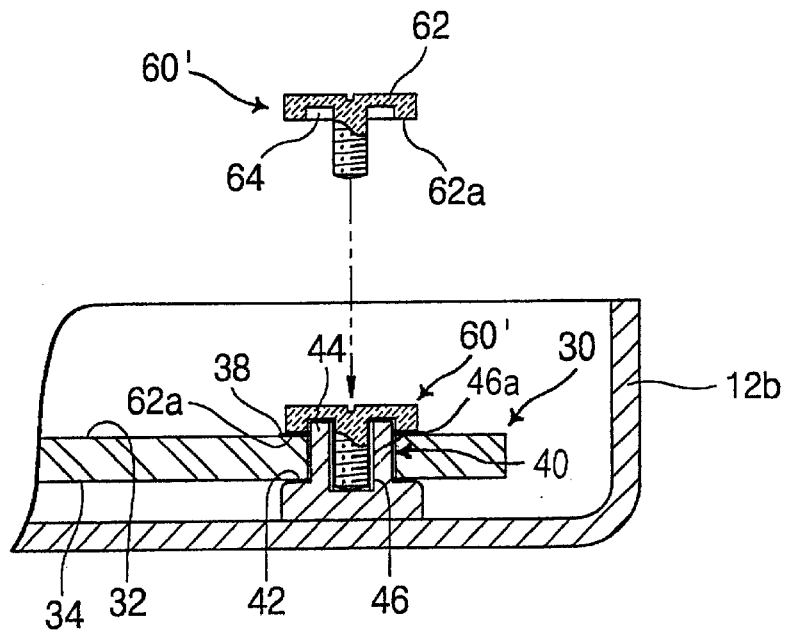
FIG. 5 shows a mounting state of a main board in a portable computer according to a second embodiment of the invention.

A main board mounting assembly shown in FIG. 5 is similar to the assembly as described in FIGS. 2 through 4B with one of the differences being the omission of a cap 50 below the head of a screw 60 and the addition of the cap to a head 62 of a screw 60'. In the assembly features, the screw 60' has a groove 64 on which an upper side 44 of the boss 40 is located. The head 62 is so wide that a lower side 62a may be contacted with the metal layer 38. If the screw 60' is coupled to a screw hole 46a of the boss 40, an upper side 44 of the boss 40 is inserted into the groove 64. A lower side 62a of the head 62 is in contact with a metal layer 38 adhered to the upper side 32 of the main board 30. The main board mounting assembly of this embodiment shown in FIG. 5 omits a cap 50 of one embodiment as shown in FIGS. 3 through 4B to improve assembly capability, and reduces coupling height to as much as the thickness of the cap.

Figure 6:
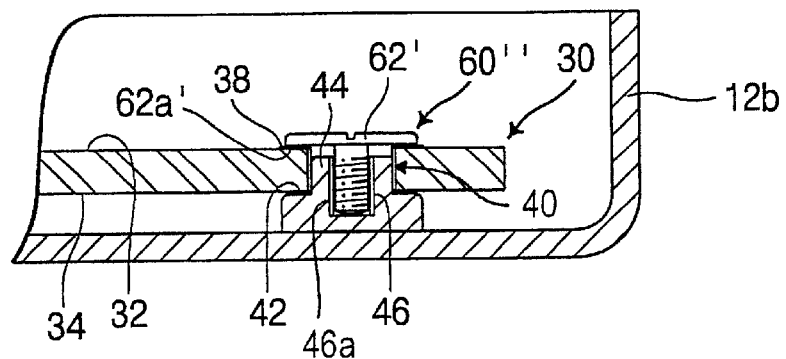
FIG. 6 shows a mounting state of a main board in a portable computer according to a third embodiment of the invention.

As shown in FIG. 6, an upper side 44 of a boss 40 is inserted into a penetration hole 36 of a main board 30. At this time, it is undesirable that the upper side 44 of the boss 40 should be protruding towards the upper side 32 of the main board 30. A screw 60" is coupled to the boss 40 inserted through the penetration hole 36. At this time, it is desirable that the screw 60" should use a head 62' of a wide type so as to be in contact with a metal layer 38 of the main board 30. In a main board mounting assembly according to this embodiment, a boss is not protruding towards an upper side 32 of a main board 30 through a penetration hole 36. Consequently, the height of coupling a screw 60" with a boss 40 of a portable computer 10 may be reduced as much as the screw 60" itself.

Such a main board mounting assembly may effectively be used in different kinds of computers such as a notebook computer, Wallet PC (personal computer), PDA (personal digital assistant), HPC (hand-held personal computer), and Mobile Computer in which a printed circuit board is installed.

Although a boss is not high, a main board can strongly and stably be coupled thereto. Therefore, it is possible to highly minimize installation height of the main board. Further, a ground metal plate adhered to the main board, a cap, a boss, and a screw are in contact with one another through a wide surface area, enabling EMI noise created in the main board to be smoothly drained through the contacted wide portion. As a result, problems related to the EMI noise can be minimized.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A printed circuit board mounting assembly, comprising:
a housing;
a printed circuit board having at least one first hole, the first bole penetrating from an upper side to a lower side of said printed circuit board;
a boss being installed in said housing and inserted into the first hole of said printed circuit board, a top surface of said boss protruding towards said upper side of said printed circuit board;
a first member formed around a circumference of said boss and supporting said printed circuit board;
a cap covering the top surface of said boss and contacting with said upper side of said printed circuit board; and
a coupling member fastening to said boss through said cap to secure said printed circuit board to said housing.

2. The printed circuit board mounting assembly of claim 1, wherein a conductive paint is coated on a surface of said cap and a metal layer is coated on said upper side of said printed circuit board connected to said cap, allowing electromagnetic interference noise created in said printed circuit board to drain from said metal layer through said cap to said housing.

3. The printed circuit board mounting assembly of claim 1, wherein said boss having a second hole with a helical groove accommodating said coupling member.

4. The printed circuit board mounting assembly of claim 1, wherein said housing having a bottom portion coupling with a top portion, the top portion pivotally attached to a display unit and accommodating an input device and a pointing device, the display unit providing variable video display, said housing accommodating electronic components that perform functions of a portable computer.

5. The printed circuit board mounting assembly of claim 1, wherein a top portion of said cap has a third hole accommodating said coupling member and an orifice of a greater diameter than the third hole formed on a bottom portion of said cap accommodating the top surface of said boss protruding from said printed circuit board.

6. An apparatus, comprising:
a display unit providing variable video display;
a housing of a portable computer having a bottom portion coupling with a top portion, the top portion pivotally attached to said display unit and accommodating an input device and a pointing device, said housing accommodating electronic components that perform functions of the portable computer;
a circuit board having at least one first hole coupling with the bottom portion of said housing, said circuit board accommodating a microprocessor controlling functions of the portable computer;
at least one boss having an opening formed in said housing, said boss protruding from the bottom portion of said housing and inserted into the first hole of the circuit board;
a first member formed around a circumference of said boss and supporting said circuit board; and
a coupling member fastening said circuit board with said boss, said coupling member being inserted into the opening of said boss through the first hole of said circuit board, said coupling member including a head portion of a diameter greater than that of the first hole of said circuit board and securing said circuit board when a bottom portion of said coupling member fastens with said boss.

7. The apparatus of claim 6, wherein a top portion of said boss is protruding through to an upper side of said circuit board and in contact with a bottom surface of the head of said coupling member.

8. The apparatus of claim 7, wherein a metal layer is coated on the upper side of said circuit board in contact with the bottom surface of the head of said coupling member, allowing electromagnetic interference noise created in said circuit board to drain from said metal layer through said coupling member to said housing.

9. The apparatus of claim 6, wherein said boss has a height small enough to not protrude through to an upper side of said circuit board.

10. The apparatus of claim 6, wherein at least one groove on the bottom surface of the head portion radially circumscribing the bottom portion of said coupling member and accommodating said boss.

11. The apparatus of claim 10, wherein the groove has a thickness not less than the peripheral thickness of said boss.

12. The apparatus of claim 6, further comprising a cap covering the top surface of said boss and contacting with an upper side of said circuit board.

13. The apparatus of claim 12, wherein a conductive paint is coated on a surface of said cap and a metal layer is coated on the upper side of said circuit board connected to said cap, allowing electromagnetic interference noise created in said circuit board to drain from said metal layer through said cap to said housing.

14. A method, comprising the steps of:
forming a housing of a portable computer by coupling a bottom portion with a top portion of said housing of a portable computer and pivotally attaching a display unit providing variable video display to said housing, the top portion accommodating an input device and a pointing device, said housing accommodating electronic components that perform functions of the portable computer;
forming a first hole in a circuit board accommodating a microprocessor controlling functions of the portable computer;
forming at least one boss having an opening in said housing, said boss protruding from the bottom portion of said housing and inserted into the first hole of said circuit board;
forming a first member around a circumference of said boss and supporting said circuit board; and
fastening a coupling member with said boss, said coupling member being inserted into the opening of said boss through the first hole of said circuit board, said coupling member including a head portion of a diameter greater than the first hole of said circuit board and securing said circuit board when a bottom portion of said coupling member fastens with said boss.

15. The method of claim 14, further comprising the step of covering a top surface of said boss with a cap and contacting with an upper side of said circuit board.

16. The method of claim 15, further comprising the step of coating a conductive paint on a surface of said cap and a metal layer is coated on the upper side of said circuit board connected to said cap, allowing electromagnetic interference noise created in said circuit board to drain from said metal layer through said cap to said housing.

17. The method of claim 16, wherein a top portion of said cap has a second hole accommodating said coupling member and an orifice of a greater diameter than the second hole formed on a bottom portion of said cap accommodating the top surface of said boss protruding from said circuit board.

18. The method of claim 14, wherein said boss has a height small enough to not protrude through to an upper side of said circuit board.

19. The method of claim 14, wherein a top portion of said boss is protruding through to an upper side of said circuit board and in contact with a bottom surface of the head of said coupling member.

20. The method of claim 19, wherein a metal layer is coated on the upper side of said circuit board in contact with the bottom surface of the head of said coupling member, allowing electromagnetic interference noise created in said circuit board to drain from said metal layer through said coupling member to said housing.

* * * * *